United States Patent
Hau-Riege et al.

(10) Patent No.: US 6,833,321 B2
(45) Date of Patent: Dec. 21, 2004

(54) METHOD OF MAKING A SEMICONDUCTOR DEVICE THAT HAS COPPER DAMASCENE INTERCONNECTS WITH ENHANCED ELECTROMIGRATION RELIABILITY

(75) Inventors: Stefan Hau-Riege, Milpitas, CA (US); R. Scott List, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 311 days.

(21) Appl. No.: 10/001,305

(22) Filed: Nov. 30, 2001

(65) Prior Publication Data

US 2003/0104692 A1 Jun. 5, 2003

(51) Int. Cl.[7] .................................... H01L 21/44
(52) U.S. Cl. .................................... 438/659
(58) Field of Search ................ 438/658, 643, 438/627, 622, 585, 527, 515, 659, 597, 596, 561, 644, 660, 673, 677, 687

(56) References Cited

U.S. PATENT DOCUMENTS

| | | | | |
|---|---|---|---|---|
| 5,185,294 A | * | 2/1993 | Lam et al. | 438/515 |
| 5,614,764 A | | 3/1997 | Baerg et al. | 257/767 |
| 5,904,560 A | | 5/1999 | Brumley | 438/639 |
| 5,909,635 A | | 6/1999 | Marieb et al. | 438/625 |
| 6,077,775 A | * | 6/2000 | Stumborg et al. | 438/643 |
| 6,191,029 B1 | | 2/2001 | Hsiao et al. | 438/633 |
| 6,221,747 B1 | * | 4/2001 | Wu et al. | 438/597 |
| 6,297,147 B1 | * | 10/2001 | Yang et al. | 438/627 |
| 6,566,262 B1 | * | 5/2003 | Rissman et al. | 438/687 |

* cited by examiner

Primary Examiner—David Zarneke
Assistant Examiner—Monica D. Harrison
(74) Attorney, Agent, or Firm—Mark V. Seeley

(57) ABSTRACT

A method of making a semiconductor device is described. That method comprises forming a conductive layer that contacts a via, such that the conductive layer includes a higher concentration of an electromigration retarding amount of a dopant near the via than away from the via.

4 Claims, 6 Drawing Sheets

METHOD OF MAKING A SEMICONDUCTOR DEVICE THAT HAS COPPER DAMASCENE INTERCONNECTS WITH ENHANCED ELECTROMIGRATION RELIABILITY

FIELD OF THE INVENTION

The present invention relates to a method of making semiconductor devices, in particular, devices that include copper damascene interconnects.

BACKGROUND OF THE INVENTION

When making advanced semiconductor devices, copper interconnects may offer a number of advantages over those made from aluminum. For that reason, copper has become the material of choice for making such devices' interconnects. As device dimensions shrink so does conductor width—leading to higher resistance and current density. Increasing current density can increase the rate at which copper atoms are displaced when current passes through a copper conductor. Such electromigration can cause accumulation of vacancies, which may lead to voids. If the voids grow to a size that creates metal separation, they may cause an open-circuit failure.

One way to prevent electromigration from causing interconnect failure is to limit the amount of current that passes through the conductor. That solution to the electromigration problem is impractical, however, because devices will operate at progressively higher currents, even as they continue to shrink. As an alternative, interconnect reliability can be enhanced by doping the interconnect—as adding dopants to the conductor can reduce the speed at which copper diffuses. When doping a copper interconnect to reduce electromigration, current processes dope the entire conductor. Techniques for achieving such global doping include using: doped seed layers, a plating or sputtering process that adds dopants to the conductor as it is formed, or ion implantation to implant dopants into the conductor.

Doping the entire interconnect can raise its resistance significantly. To reduce RC delay that is associated with high resistance, it may be necessary to limit dopant concentration—or dispense with doping altogether, e.g., when forming high speed conductors. When low level doping is required to limit conductor resistance, the electromigration mitigating impact that such doping provides is reduced.

Accordingly, there is a need for an improved process for making a semiconductor device that includes copper interconnects. There is a need for such a process that reduces electromigration without significantly raising conductor resistance. The method of the present invention provides such a process.

DETAILED DESCRIPTION OF THE PRESENT INVENTION

A method for making a semiconductor device is described. That method comprises forming a conductive layer that contacts a via such that the conductive layer includes a higher concentration of an electromigration retarding amount of a dopant near the via than away from the via. In the method of the present invention, the via may be formed prior to forming the conductive layer on the via, or the conductive layer may be formed prior to forming the via on the conductive layer. The dopant may be introduced into the conductive layer in various ways, e.g., by depositing a dopant containing layer onto an exposed portion of the conductive layer, by ion implanting the dopant into that exposed portion, or subjecting that exposed portion to a gas that contains the dopant. After bringing the dopant into contact with the conductive layer, heat may be applied to cause the dopant to diffuse into that layer.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

The method of the present invention may be used in many contexts. In a preferred embodiment, it is used to improve the electromigration reliability of copper interconnects, which are formed when making semiconductor devices. As illustrated below, the method may be used to modify copper conductors that act as either enclosure structures (i.e., structures that ensure contact between a conductor and a via formed on it) or coverage structures (i.e., structures that ensure contact between a conductor and a via formed under it).

Figure 1A:
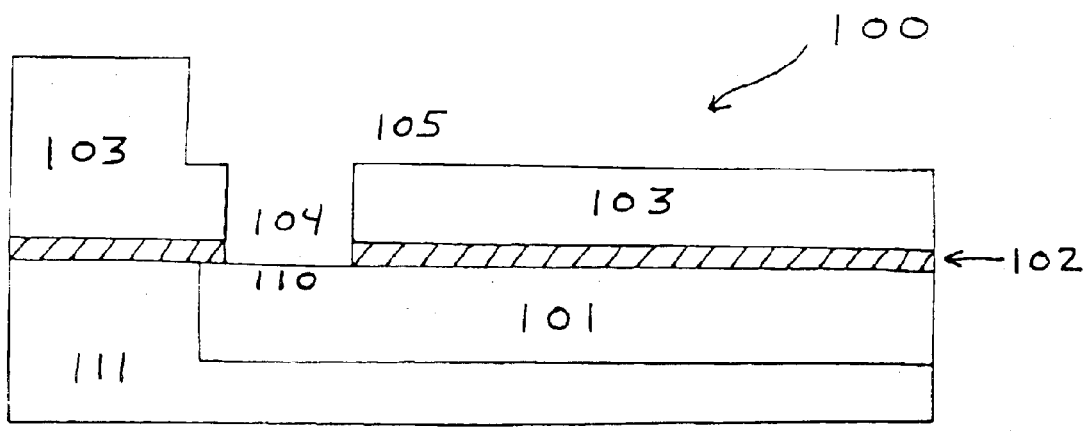
FIGS. 1a–1d represent cross-sections of structures that may result after certain steps are used to make a semiconductor device using a first embodiment of the method of the present invention.

FIGS. 1a–1d, 2a–2c and 3a–3c represent cross-sections of structures that may be formed when making a semiconductor device using the method of the present invention to reduce electromigration in a copper conductor that serves as an enclosure structure. FIG. 1a represents structure 100, which includes conductive layer 101 upon which is formed barrier layer 102 and dielectric layer 103. (Conductive layer 101 is formed within dielectric layer 111.) When forming a copper interconnect for a device using a dual damascene process, via 104 and trench 105, which have been etched into dielectric layer 103, will be filled with a second conductive layer. Structure 100 may be made using conventional processes that are well known to those skilled in the art.

Conductive layer 101 is preferably made from copper, but may be made from other conductive materials. At this stage of the process, conductive layer 101 may be undoped. Alternatively, layer 101 may be doped with an electromigration retarding amount of a dopant, which will not significantly increase layer 101's resistance. Preferred dopants may be derived from aluminum, cadmium, magnesium, tin and zirconium. When conductive layer 101 is globally doped, the concentration of such a dopant preferably should be kept below about 1 atomic %. The optimum dopant concentration will, of course, depend upon layer 101's characteristics, the type of dopant used, and the function layer 101 will perform.

Barrier layer 102 serves to minimize diffusion from conductive layer 101 into dielectric layer 103. Barrier layer 102 also acts as an etch stop to prevent the via etch step from exposing conductive layer 101 to subsequent cleaning steps. Barrier layer 102 preferably is made from silicon nitride, silicon oxynitride or silicon carbide, but may be made from other materials. Dielectric layer 103 preferably comprises silicon dioxide, but may be made from materials with a lower dielectric constant, e.g., SiOF, carbon doped oxide, or a porous oxide. Other low k materials that may be used to make dielectric layer 103 include organic polymers such as a polyimide, parylene, polyarylether, polynaphthalene, or polyquinoline.

In this embodiment of the present invention, via 104 has been etched through a portion of barrier layer 102 to expose portion 110 of conductive layer 101. A dopant will be introduced into layer 101 by bringing the dopant into contact with exposed portion 110, then applying heat to cause the dopant to diffuse into conductive layer 101. The dopant selected must retard electromigration without significantly raising resistance. In addition, it should diffuse into conductive layer 101 to protect an enlarged region located near the via, and to produce a graded dopant profile that prevents a new flux divergence site from forming, which could lead to interconnect failure. Although the selected dopant should diffuse into conductive layer 101, it preferably should not diffuse into dielectric layer 103. Preferred materials for locally doping conductive layer 101 include the same materials that may be used to globally dope that layer—e.g., aluminum, cadmium, magnesium, tin and zirconium. Although these elements are preferred, others may be used instead to dope exposed portion 110 of layer 101.

Figure 1B:
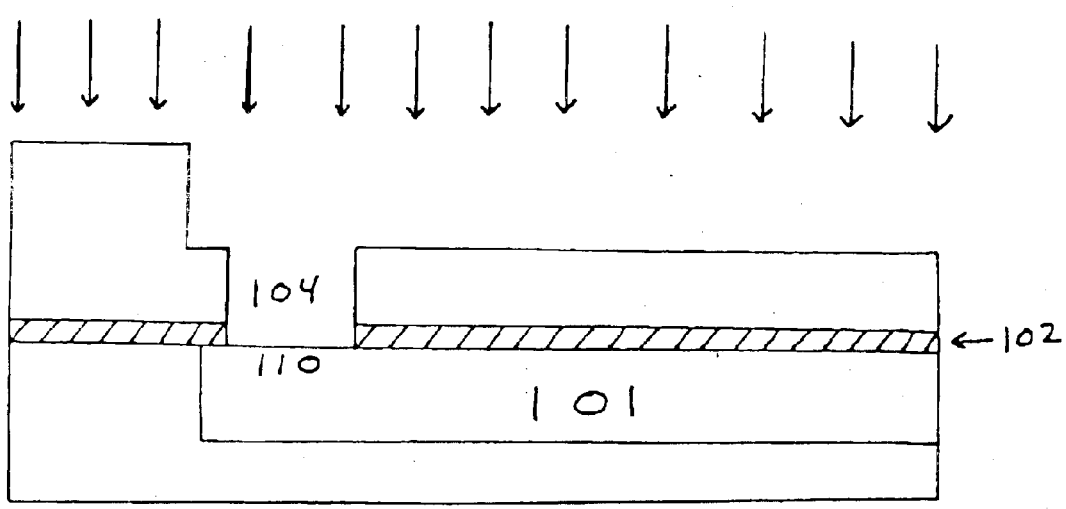
Figure 1C:
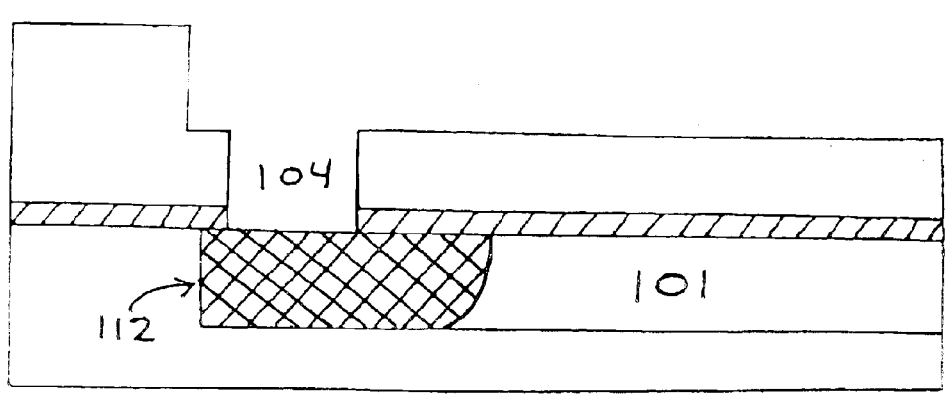
Figure 1D:
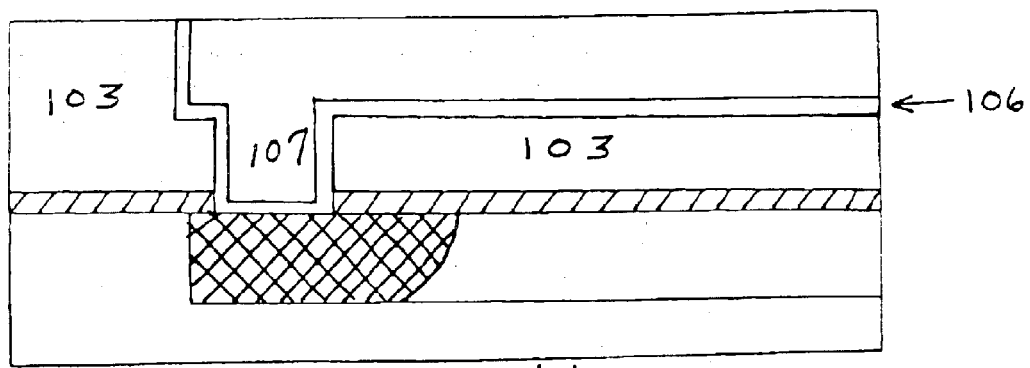

The dopant may be brought into contact with layer 101 in various ways. One way, as FIG. 1b illustrates, is simply to implant dopant ions into exposed portion 110. In a preferred embodiment, such an ion implant process should apply the dopant at a dose of between about $1 \times 10^{14}$ and about $1 \times 10^{16}$ atoms/cm$^2$. Such a process may cause the surface of conductive layer 101 near via 104 to include the dopant at a concentration that is between about 0.1 atomic % and about 10 atomic %. If conductive layer 101 is globally doped previously, this ion implantation step should cause the dopant concentration near the via to be at least about twice the dopant concentration away from the via. The dopant ions may be implanted into exposed portion 110 of conductive layer 101 using conventional ion implantation equipment and processes. Although ions preferably should be implanted into an exposed part of layer 101, it may be possible to dope the conductive layer by implanting ions through barrier layer 102—if a high energy implant is performed, and if the barrier layer is relatively thin.

After ions are implanted into conductive layer 101, heat is applied to cause them to diffuse into that layer. Subsequent high temperature process steps may drive the dopant a sufficient distance into layer 101. Alternatively, after the ion implant step, structure 100 may be annealed. Such an anneal can drive the dopant further into layer 101. The device should be heated at a sufficient temperature for a sufficient time to create a doped region within conductive layer 101 that gives that layer improved electromigration characteristics without significantly raising its resistance. Applying such an anneal may generate the structure illustrated in FIG. 1c. Although doped region 112 of conductive layer 101 is shown extending a distance beyond via 104, which is about equal to the width of the via, the process of the present invention may be tailored to form doped regions that extend a greater or lesser degree into conductive layer 101 than is shown here.

When making a copper interconnect, after such an anneal step, barrier layer 106 and a seed layer may be deposited onto structure 100. Barrier layer 106 may comprise tantalum, tantalum nitride or titanium nitride and the seed layer may comprise copper. The barrier and seed layers will line via 104 and trench 105 and cover portions of dielectric layer 103. After lining via 104 and trench 105 with barrier layer 106, the via and trench are filled with copper, e.g., using a conventional copper electroplating process. After copper layer 107 is deposited, it may be polished, e.g, by applying a chemical mechanical polishing ("CMP") step, until its surface is substantially flush with (or recessed slightly below) the surface of dielectric layer 103. (That polishing step may be followed by a standard cleaning process.) At the same time, the CMP step may remove barrier layer 106 where it covers dielectric layer 103—generating the FIG. 1d structure.

After completing all high temperature steps, the dopant concentration near the via preferably is at least about 0.1 atomic % and more preferably at least about 1 atomic %. Another way to introduce dopants into exposed portion 110 of conductive layer 101 is to subject that exposed portion to a gas that contains the dopant, using conventional furnace diffusion techniques.

Figure 2A:
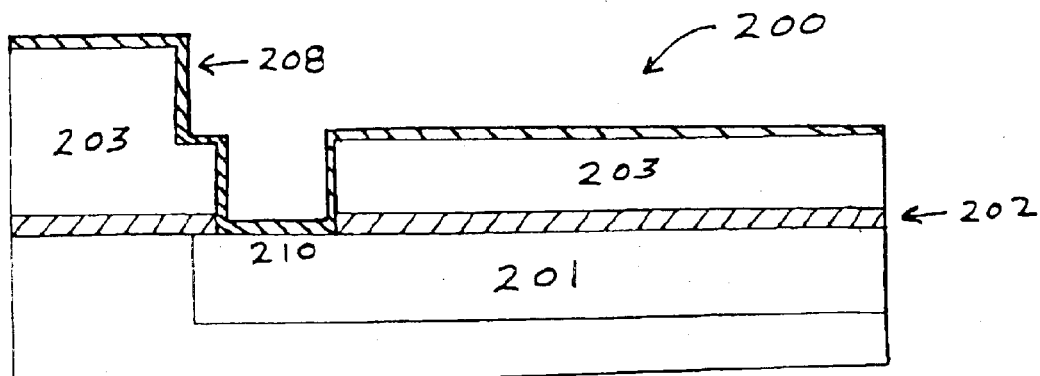
FIGS. 2a–2c represent cross-sections of structures that may result after certain steps are used to make a semiconductor device using a second embodiment of the method of the present invention.
Figure 2B:
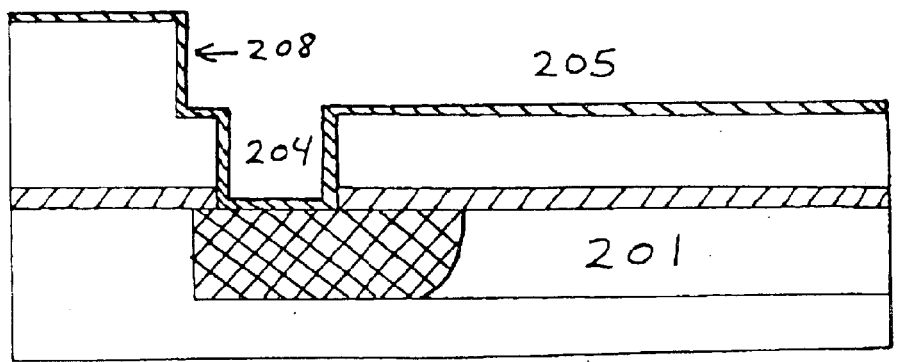
Figure 2C:
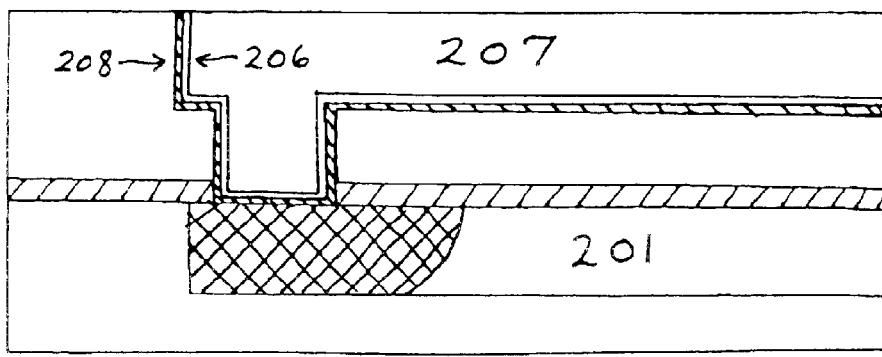

FIGS. 2a–2c represent an embodiment of the present invention in which dopant is brought into contact with exposed portion 210 of layer 201 by depositing a dopant containing layer onto that exposed portion. FIG. 2a represents structure 200 in which dopant containing layer 208 was deposited onto dielectric layer 203, after a portion of barrier layer 202 was removed to expose portion 210 of conductive layer 201. Layer 208 may include any of the dopants identified above, and may be formed using a conventional chemical vapor deposition process.

After forming dopant containing layer 208, heat is applied to cause the dopant to diffuse into layer 201, generating the structure illustrated in FIG. 2b. As with the ion implantation example described above, after the dopant diffuses into conductive layer 201, the surface of that layer near via 204 should include the dopant at a concentration of between about 0.1 atomic % and about 10 atomic %, and more preferably a concentration that exceeds about 1 atomic %. In this embodiment of the present invention, barrier layer 206 is then formed on layer 208, and via 204 and trench 205 are filled to form copper layer 207, which may be polished to produce the FIG. 2c structure. Although in this embodiment barrier layer 206 is formed on dopant containing layer 208, in alternative embodiments layer 208 may be removed after the dopant has been driven into layer 201 and prior to forming barrier layer 206. When removing layer 208 prior to forming layer 206, layer 208 may be removed using a conventional wet or dry etching process, as will be apparent to those skilled in the art.

Figure 3A:
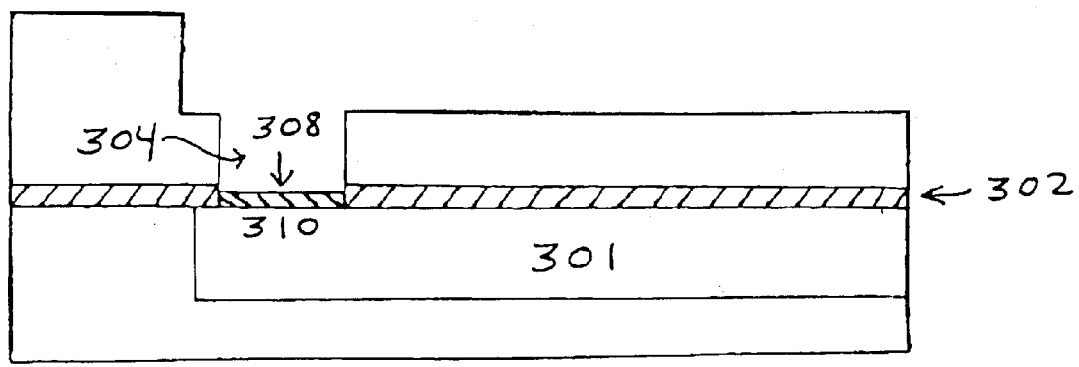
FIGS. 3a–3c represent cross-sections of structures that may result after certain steps are used to make a semiconductor device using a third embodiment of the method of the present invention.
Figure 3B:
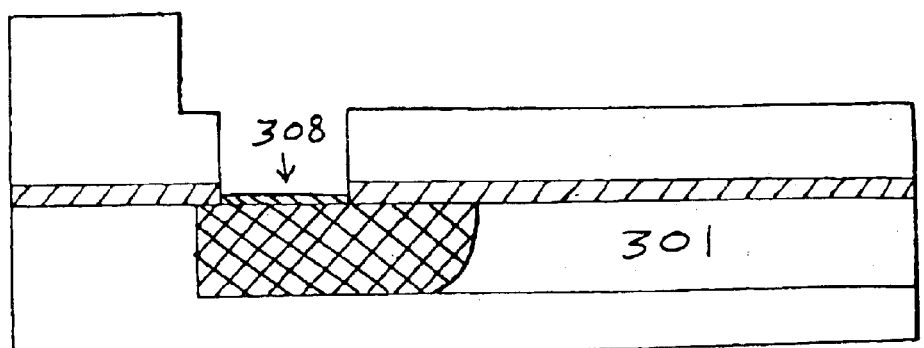
Figure 3C:
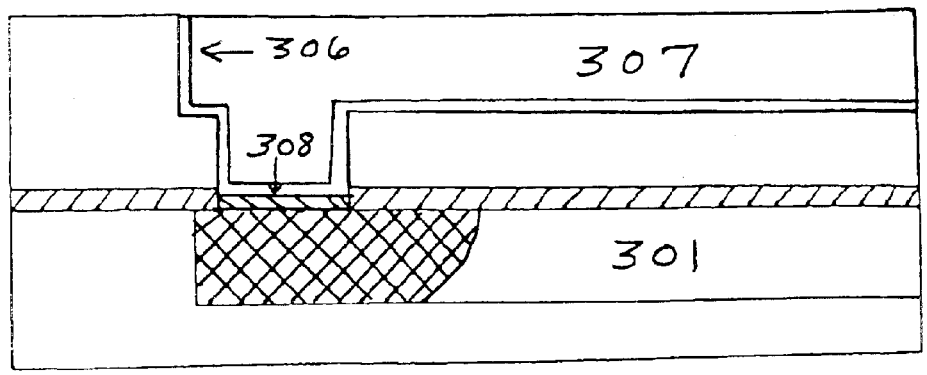

As in the embodiment just described, FIGS. 3a–3c represent structures that may result when depositing a dopant containing layer onto exposed portion 310 of layer 301. In this embodiment, however, dopant containing layer 308 is formed only on exposed portion 310—as shown in FIG. 3a. Dopant containing layer 308 may be formed at the bottom of via 304, after part of barrier layer 302 is removed, by selectively depositing that layer using a selective chemical vapor deposition process or a conventional electroless plating process.

After forming dopant containing layer 308, heat is applied—as in the embodiments described above—to cause the dopant to diffuse into layer 301, generating the structure illustrated in FIG. 3b. Barrier layer 306 and copper layer 307 are then formed to produce the FIG. 3c structure. Although, here, barrier layer 306 is formed on dopant containing layer 308, layer 308 may be removed after driving the dopant into layer 301 and prior to forming barrier layer 306.

Figure 4A:
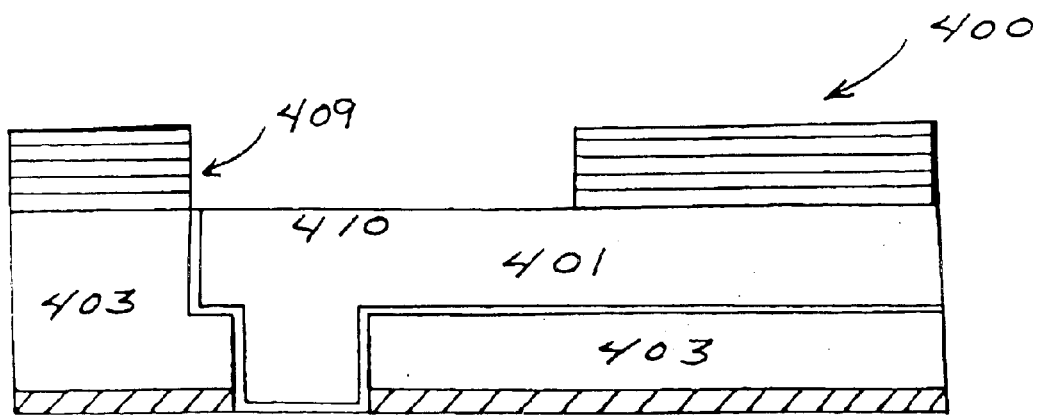
FIGS. 4a–4c represent cross-sections of structures that may result after certain steps are used to make a semiconductor device using a fourth embodiment of the method of the present invention.

FIGS. 4a–4c, 5a–5d and 6a–6b represent cross-sections of structures that may be formed when making a semiconductor device using the method of the present invention to reduce electromigration in a copper conductor that serves as a coverage structure. FIG. 4a represents structure 400, which includes conductive layer 401. Conductive layer 401 fills a trench and via that had been etched into dielectric layer 403. Conductive layer 401 preferably comprises copper and may be doped or undoped. As with the enclosure structure described above, if conductive layer 401 is globally doped, the dopant concentration should be kept below about 1 atomic %.

In this embodiment of the present invention, photoresist layer 409 has been deposited onto conductive layer 401 and dielectric layer 403, then patterned to expose portion 410 of conductive layer 401. A dopant may be introduced into layer 401 by bringing the dopant into contact with exposed portion 410, then applying heat to cause the dopant to diffuse into conductive layer 401.

Figure 4B:
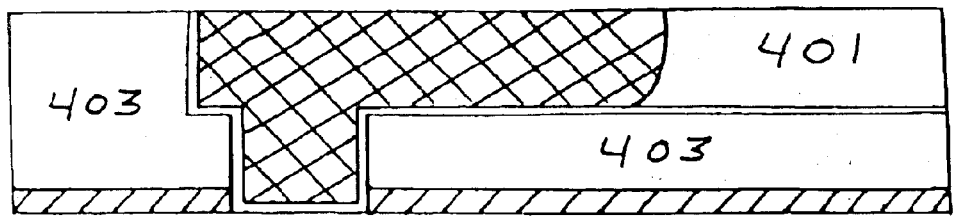

After patterning photoresist layer 409, dopant ions may be implanted into exposed portion 410 using conventional ion implantation equipment and processes. After ions are implanted into conductive layer 401, photoresist layer 409 is removed. When conductive layer 401 comprises copper, a forming gas may be used to remove the photoresist. Using a forming gas ensures that the photoresist removal process will not oxidize, or otherwise adversely affect, the underlying copper. After the photoresist is removed, heat is applied to cause the dopant to diffuse into layer 401, as FIG. 4b illustrates. Subsequent high temperature process steps may serve to drive the dopant into layer 401, or an anneal step may be used to perform that dopant driving function.

After dopants are driven into layer 401, barrier layer 402 may be formed on layers 401 and 403. Barrier layer 402 may comprise silicon nitride or silicon carbide, and may be deposited onto layers 401 and 403 in the conventional manner. This generates the structure shown in FIG. 4c. After completing all high temperature process steps, the dopant concentration near the via preferably is between about 0.1 atomic % and about 10 atomic %, and more preferably greater than about 1 atomic %. When other portions of layer 401 are also doped, to help reduce electromigration, the dopant concentration near the via preferably is at least twice the dopant concentration away from the via.

Figure 4C:
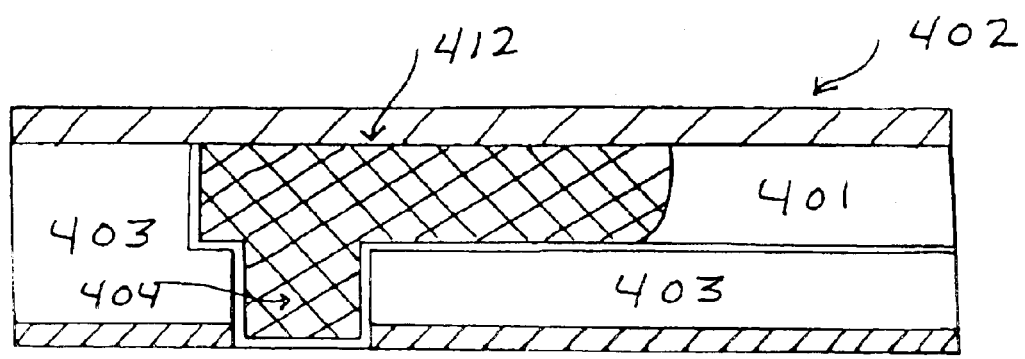

As shown in FIG. 4c, when doping a coverage structure, via 404 and the part of conductive layer 401 that lies above it should be completely doped. Although doped region 412 of conductive layer 401 is shown extending a distance beyond via 404, which is about equal to twice the width of the via, doped regions that extend further, or not as far, into conductive layer 401 may be formed instead. Rather than implanting ions, dopants may be introduced into conductive layer 401 by exposing portion 410 to a gas that contains the dopant, using conventional furnace diffusion techniques.

Figure 5A:
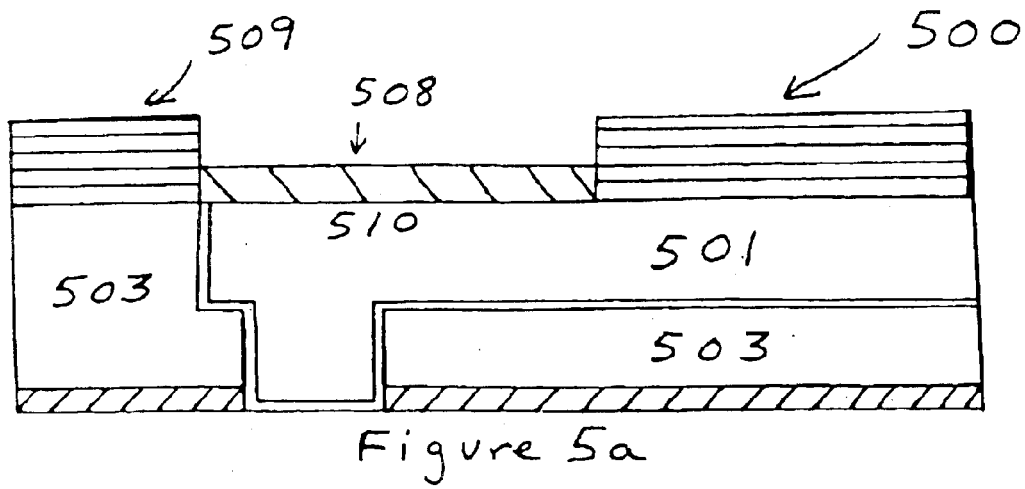
FIGS. 5a–5d represent cross-sections of structures that may result after certain steps are used to make a semiconductor device using a fifth embodiment of the method of the present invention.
Figure 5B:
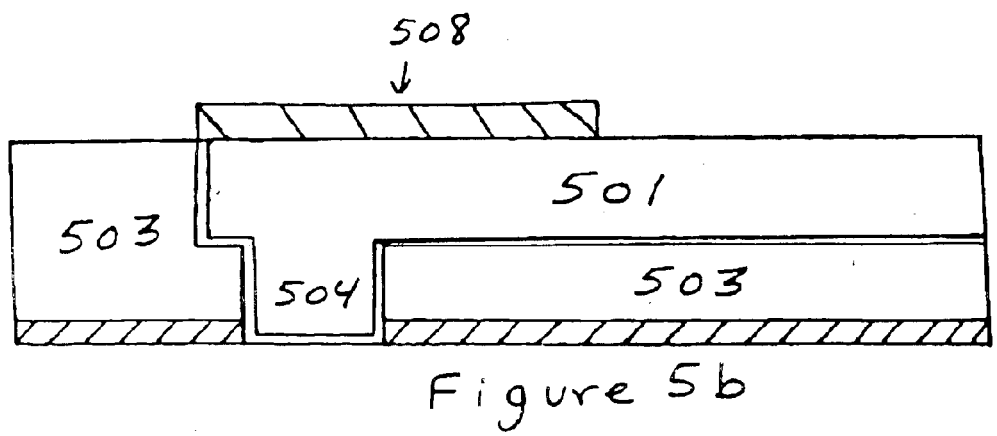
Figure 5C:
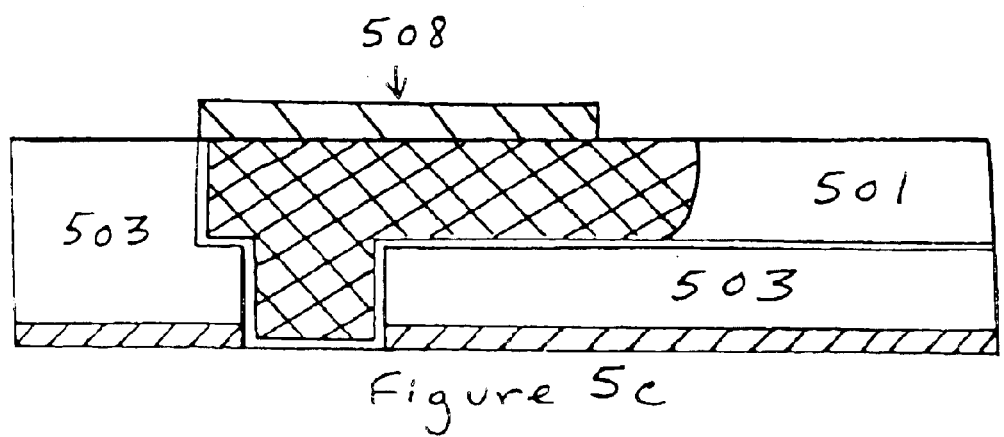
Figure 5D:
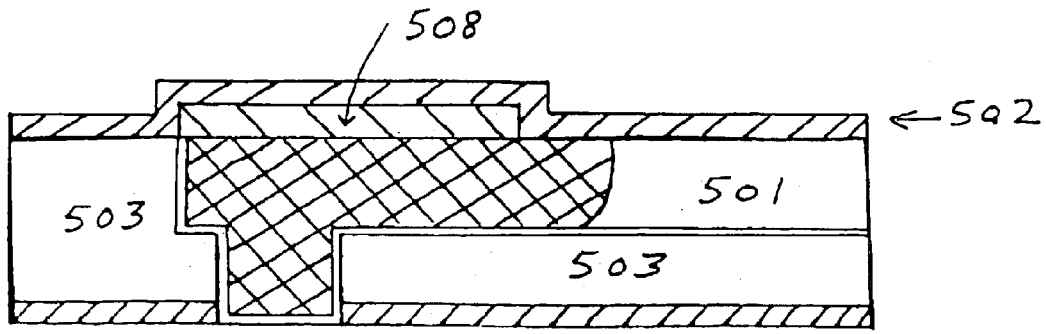

FIGS. 5a–5d represent an embodiment of the present invention in which dopant is brought into contact with exposed portion 510 of conductive layer 501 by depositing a dopant containing layer onto that exposed portion. FIG. 5a represents structure 500 in which dopant containing layer 508 was deposited onto exposed portion 510, after forming the FIG. 4a structure, instead of implanting ions. As already mentioned, layer 508 may be formed using conventional chemical vapor deposition or electroless plating processes.

Photoresist layer 509 is then removed, e.g., by exposing it to a forming gas. This leaves a structure like the one shown in FIG. 5b. (The FIG. 5b structure may instead be formed by: (1) depositing a dopant containing layer on dielectric layer 503 and conductive layer 501; (2) patterning a photoresist layer on its surface such that the photoresist only covers the dopant containing layer where located above via 504; (3) removing the dopant containing layer's exposed portions; and then (4) removing the photoresist.) Heat is applied to cause the dopant to diffuse into layer 501, generating the structure illustrated in FIG. 5c. As indicated above, barrier layer 502 may be formed on layers 501 and 503, after dopants are driven into layer 501, to generate the FIG. 5d structure. Although in this embodiment, barrier layer 502 is formed on layer 508, in alternative embodiments, layer 508 may be removed prior to forming barrier layer 502.

Figure 6A:
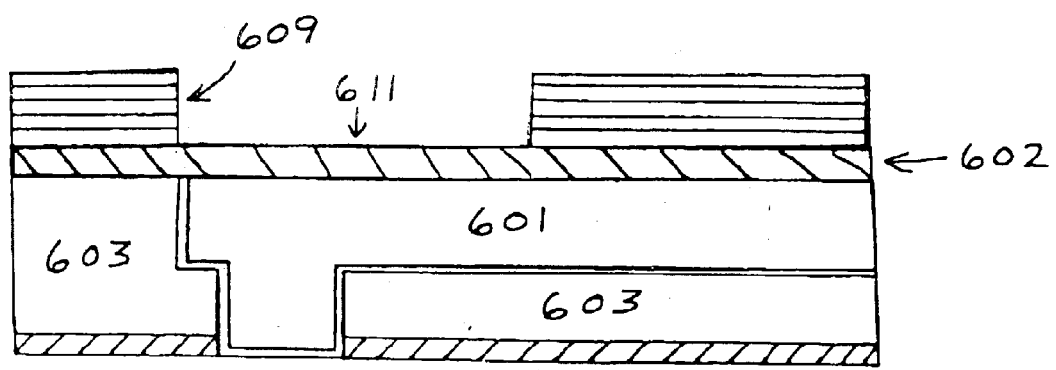
FIGS. 6a–6b represent cross-sections of structures that may be made when making a semiconductor device using variations of the processes described with reference to FIGS. 4a–4c and 5a–5d.
Figure 6B:
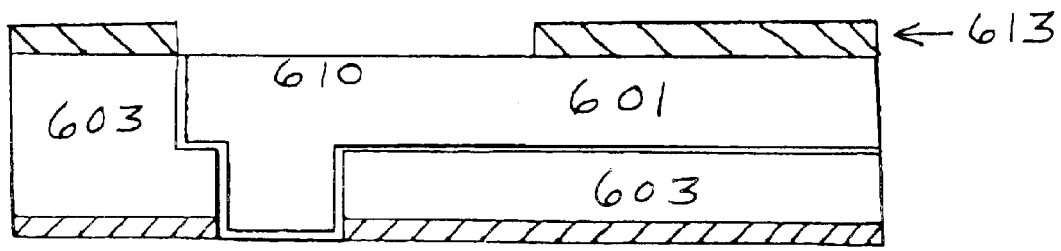

FIGS. 6a–6b represent cross-sections of structures that may be made when making a semiconductor device using variations of the processes described with reference to FIGS. 4a–4c and 5a–5d. FIG. 6a reflects a structure in which conductive layer 601 and dielectric layer 603 are covered with barrier layer 602. Barrier layer 602 preferably comprises silicon nitride or silicon carbide. Photoresist layer 609 has been deposited onto barrier layer 602, then patterned to expose portion 611 of layer 602.

Exposed portion 611 is then removed, e.g., by applying a conventional etching process, followed by removing photoresist layer 609, e.g., by subjecting that layer to a forming gas. The resulting structure, shown in FIG. 6b, includes hard mask 613. That hard mask performs the masking function that the patterned photoresist layer performed in the embodiments described above in connection with FIGS. 4a–4c and 5a–5d. Hard mask 613 protects dielectric layer 603, and unexposed portions of conductive layer 601, when dopants are brought into contact with exposed portion 610 of layer 601. Any of the methods described above for locally doping the conductive layer may then be used to form structures like those shown in FIGS. 4c and 5d.

Electromigration induced voiding in copper interconnects occurs primarily near the cathode via at the copper/barrier layer interface. The process of the present invention improves interconnect electromigration by locally doping the conductive layer near the via, slowing down electromigration at the region most susceptible to open circuit failure due to voids that may cause metal separation. Unlike global doping (i.e., doping the entire conductor), such local doping will not significantly increase electrical resistance. As a consequence, when the rest of the conductor remains undoped, the region near the via can be doped at a higher concentration than global doping may allow. Higher doping means improved electromigration characteristics. The method of the present invention thus enables similar, or even better, electromigration reliability with less resistance.

Features shown in the above referenced drawings are not intended to be drawn to scale, nor are they intended to be shown in precise positional relationship. Additional steps that may be used to make a semiconductor device using the described process have been omitted as they are not useful to describe aspects of the present invention.

Although the foregoing description has specified certain steps and materials that may be used in the above described method for making a semiconductor device with a conductive layer that has improved electromigration reliability, those skilled in the art will appreciate that many modifications and substitutions may be made. For example, although the embodiments described above relate to conductive layers that are coupled to vias, the method of the present invention may be applied to locally dope a conductive layer that is coupled to a transistor's contacts. Moreover, the present invention may be applied when making either coverage or enclosure structures, or both types of structures. It is thus intended that all modifications, alterations, substitutions and additions to the specific embodiments described above be considered to fall within the spirit and scope of the invention as defined by the appended claims.

What is claimed is:

1. A method of making a semiconductor device comprising:
    forming a conductive layer on a substrate;
    forming a barrier layer on the conductive layer;
    forming a dielectric layer on the barrier layer;
    etching a via through the dielectric layer and a portion of the barrier layer to expose a portion of the conductive layer above which the via is located; and
    introducing a dopant into that portion of the conductive layer.

2. The method of claim 1 wherein the dopant is introduced into the exposed portion of the conductive layer by depositing a dopant containing layer onto that exposed portion.

3. The method of claim 1 wherein the dopant is introduced into the exposed portion of the conductive layer by ion implanting the dopant into that exposed portion.

4. The method of claim 1 wherein the dopant is introduced into the exposed portion of the conductive layer by subjecting that exposed portion to a gas that contains the dopant.

* * * * *